US009818703B2

(12) United States Patent
Jang et al.

(10) Patent No.: US 9,818,703 B2
(45) Date of Patent: Nov. 14, 2017

(54) PRINTED CIRCUIT BOARD

(71) Applicant: Samsung Electronics Co., Ltd., Suwon-si, Gyeonggi-do (KR)

(72) Inventors: Jaegwon Jang, Hwaseong-si (KR); Youngjae Kim, Hwaseong-si (KR); Baikwoo Lee, Gwangmyeong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/293,786

(22) Filed: Oct. 14, 2016

(65) Prior Publication Data

US 2017/0141050 A1    May 18, 2017

(30) Foreign Application Priority Data

Nov. 17, 2015 (KR) .................. 10-2015-0161302

(51) Int. Cl.
*H01L 23/48* (2006.01)
*H01L 23/00* (2006.01)
*H01L 23/31* (2006.01)

(52) U.S. Cl.
CPC ........ *H01L 23/562* (2013.01); *H01L 23/3121* (2013.01); *H01L 2224/16225* (2013.01); *H01L 2224/97* (2013.01); *H01L 2924/181* (2013.01)

(58) Field of Classification Search
CPC ... H01L 23/28; H01L 23/562; H01L 23/3121; H01L 21/78; H01L 21/56; H01L 41/338
USPC .................. 257/787; 438/126, 127
See application file for complete search history.

(56) References Cited

U.S. PATENT DOCUMENTS

| 5,296,738 | A | * | 3/1994 | Freyman | H01L 23/13 257/684 |
| 5,612,576 | A | * | 3/1997 | Wilson | H01L 23/3128 257/787 |
| 5,981,312 | A | * | 11/1999 | Farquhar | H01L 21/54 257/E21.501 |
| 6,000,924 | A | * | 12/1999 | Wang | B29C 33/0044 257/E21.503 |
| 6,054,755 | A | * | 4/2000 | Takamichi | H01L 23/13 257/667 |
| 6,057,597 | A | * | 5/2000 | Farnworth | H01L 23/04 257/698 |
| 6,074,897 | A | * | 6/2000 | Degani | H01L 21/563 134/1.3 |
| 6,081,997 | A | * | 7/2000 | Chia | H01L 21/565 257/E21.504 |
| 6,107,689 | A | * | 8/2000 | Kozono | H01L 23/13 257/737 |
| 6,324,069 | B1 | * | 11/2001 | Weber | H01L 21/563 174/260 |
| 6,772,512 | B2 | | 8/2004 | Tsai et al. | |
| 7,262,074 | B2 | | 8/2007 | Hall et al. | |
| 7,615,869 | B2 | | 11/2009 | Koo et al. | |

(Continued)

FOREIGN PATENT DOCUMENTS

JP 2012-195330 A 10/2012
KR 10-2013-0044051 A 5/2013

*Primary Examiner* — Nitin Parekh
(74) *Attorney, Agent, or Firm* — Myers Bigel, P.A.

(57) ABSTRACT

A printed circuit board includes chip regions on which semiconductor chips are mounted, and a scribe region surrounding each of the chip regions. The scribe region includes first vent holes that are configured to receive a flow of molding resin and are arranged along a first direction corresponding to a flow direction of the molding resin.

20 Claims, 11 Drawing Sheets

(56) References Cited

U.S. PATENT DOCUMENTS

| | | |
|---|---|---|
| 7,696,618 B2 | 4/2010 | Fan |
| 7,812,265 B2 | 10/2010 | Shin et al. |
| 8,030,748 B2 | 10/2011 | Ye et al. |
| RE44,629 E | 12/2013 | Ramalingam et al. |
| 2002/0173074 A1 | 11/2002 | Chun-Jen et al. |
| 2008/0150159 A1 | 6/2008 | Aberin et al. |

* cited by examiner

PRINTED CIRCUIT BOARD

CROSS-REFERENCE TO RELATED APPLICATION

This U.S. non-provisional patent application claims priority under 35 U.S.C. §119 to Korean Patent Application No. 10-2015-0161302, filed on Nov. 17, 2015, in the Korean Intellectual Property Office, the disclosure of which is hereby incorporated by reference in its entirety.

FIELD

Embodiments of the inventive concepts relate to a printed circuit board and, more particularly, to a printed circuit board having a top surface on which semiconductor chips are mounted and on which a molding process is performed.

BACKGROUND

A semiconductor package may protect a semiconductor chip from an external environment and may physically and electrically connect the semiconductor chip to an electronic system. A packaging technique of forming the semiconductor package may affect performance of a semiconductor device and costs, performance, and reliability of a final product. A semiconductor package may be manufactured using various members, such as a printed circuit board, a lead frame, and a circuit film. In addition, the semiconductor package may be manufactured by a bonding process, a wire process, and a molding process. If a void is generated in a molding layer during the molding process, stress may occur from the void by heat. The stress may cause a crack in the semiconductor package to reduce the reliability of the semiconductor package.

SUMMARY

Embodiments of the inventive concepts may provide a printed circuit board for a molding process, which is capable of preventing formation of a void.

In an aspect, a printed circuit board may include chip regions on which semiconductor chips are mounted, and a scribe region surrounding each of the chip regions. The scribe region may include first vent holes that are configured to receive a flow of molding resin. The first vent holes are arranged along a first direction corresponding to a flow direction of the molding resin.

In some embodiments, the first vent holes may not overlap with the semiconductor chips.

In some embodiments, the semiconductor chips may be arranged along a second direction perpendicular to the first direction, and the first vent holes may be formed between the semiconductor chips arranged along the second direction.

In some embodiments, at least one of the first vent holes may be provided between a pair of semiconductor chips adjacent to each other in the second direction. A distance between the pair of semiconductor chips may be equal to or greater than a diameter of the at least one of the first vent holes.

In some embodiments, the distance between the pair of semiconductor chips may range from about one to about four times the diameter of the at least one of the first vent holes.

In some embodiments, the first vent holes, which are formed along the first direction, may be closer to a rear of the printed circuit board in the first direction than to a front of the printed circuit board in the first direction.

In some embodiments, distances between the first vent holes formed along the first direction may be sequentially reduced in the first direction.

In some embodiments, the scribe region may include a first scribe region provided between the chip regions, and a second scribe region provided outside outermost ones of the chip regions. The scribe region may further include second vent holes formed in the second scribe region along a second direction perpendicular to the first direction.

In some embodiments, diameters of the second vent holes may be equal to or greater than diameters of the first vent holes.

In some embodiments, the semiconductor chips may be mounted on the chip regions by a flip-chip bonding method.

In an aspect, a printed circuit board may include chip regions on which semiconductor chips are mounted, and a scribe region surrounding each of the chip regions. The scribe region may include a first scribe region provided between the chip regions, and a second scribe region provided outside outermost ones of the chip regions. The first scribe region may include vent holes.

In some embodiments, the vent holes may not overlap with the semiconductor chips.

In some embodiments, the vent holes are configured to receive a flow of molding resin. The vent holes may be arranged along a direction corresponding to a flow direction of the molding resin.

In some embodiments, a length of the first scribe region between a pair of the chip regions adjacent to each other may be equal to or greater than diameters of the vent holes.

In some embodiments, the semiconductor chips may be mounted on the chip regions by a flip-chip bonding method.

In an aspect a printed circuit board includes chip regions having semiconductor chips mounted thereon, respectively, scribe regions between the chip regions, and vent holes in a first portion of the scribe regions that are configured to receive a flow of molding resin crossing a second portion of the scribe regions. The vent holes are arranged along a direction corresponding to a flow direction of the molding resin.

In some embodiments, the semiconductor chips and the vent holes do not overlap.

In some embodiments, the vent holes are first vent holes and the direction is a first direction. The printed circuit board further includes second vent holes in an edge region along a periphery of the chip regions. The second vent holes are arranged in a second direction that is not parallel to the first direction.

In some embodiments, spacing between the first vent holes decreases with increasing proximity of the first vent holes to the edge region.

In some embodiments, diameters of the second vent holes are larger than diameters of the first vent holes.

It is noted that aspects of the inventive concepts described with respect to one embodiment, may be incorporated in a different embodiment although not specifically described relative thereto. That is, all embodiments and/or features of any embodiment can be combined in any way and/or combination. These and other aspects of the inventive concepts are explained in detail in the specification set forth below.

BRIEF DESCRIPTION OF THE DRAWINGS

The inventive concepts will become more apparent in view of the attached drawings and accompanying detailed description.

DETAILED DESCRIPTION OF THE EMBODIMENTS

The inventive concepts will now be described more fully hereinafter with reference to the accompanying drawings, in which exemplary embodiments of the inventive concepts are shown. The inventive concepts and methods of achieving them will be apparent from the following exemplary embodiments that will be described in more detail with reference to the accompanying drawings. The embodiments of the inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art.

As used herein, the singular terms "a," "an" and "the" are intended to include the plural forms as well, unless the context clearly indicates otherwise. It will be understood that when an element is referred to as being "connected" or "coupled" to another element, it may be directly connected or coupled to the other element or intervening elements may be present. As used herein, the term "and/or" includes any and all combinations of one or more of the associated listed items. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Similarly, it will be understood that when an element such as a layer, region or substrate is referred to as being "on" another element, it can be directly on the other element or intervening elements may be present. In contrast, the term "directly" means that there are no intervening elements. Additionally, the embodiments in the detailed description will be described with sectional views as ideal exemplary views of the inventive concepts. Accordingly, shapes of the exemplary views may be modified according to manufacturing techniques and/or allowable errors. Therefore, the embodiments of the inventive concepts are not limited to the specific shape illustrated in the exemplary views, but may include other shapes that may be created according to manufacturing processes.

Furthermore, throughout this disclosure, directional terms such as "upper," "intermediate," "lower," and the like may be used herein to describe the relationship of one element or feature with another, and the inventive concept should not be limited by these terms. Accordingly, these terms such as "upper," "intermediate," "lower," and the like may be replaced by other terms such as "first," "second," "third," and the like to describe the elements and features.

Also, though terms like 'first' and 'second' are used to describe various elements, components, areas, layers, and/or portions in various embodiments of the inventive concept, the elements, components, areas, layers, and/or portions should not be limited by these terms. These terms are only used to distinguish one element, component, area, layer, or portion from another. Thus, a first element, component, area, layer or section discussed below could be termed a second element, component, area, layer or section without departing from the teachings of the inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Exemplary embodiments of aspects of the present inventive concepts explained and illustrated herein include their complementary counterparts. The same reference numerals or the same reference designators denote the same elements throughout the specification.

Figure 1:
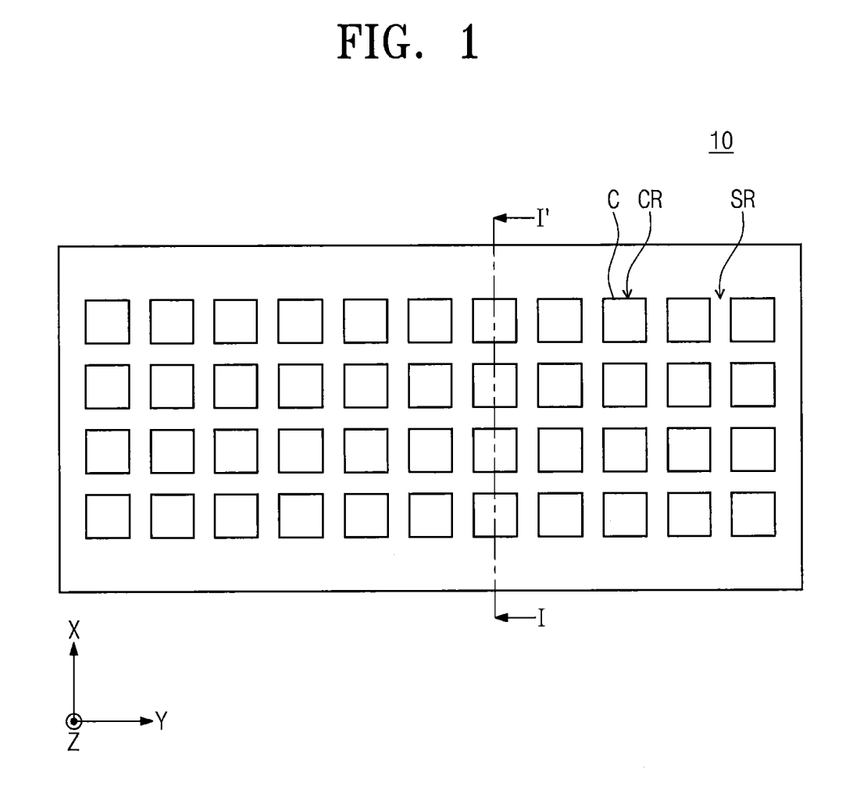
FIG. 1 is a plan view illustrating a general printed circuit board.

FIG. 1 is a plan view illustrating a general printed circuit board 10. The printed circuit board 10 may have a top surface on which semiconductor chips C are mounted and on which a molding process is performed. The molding process may mean a process of sealing a semiconductor device or a circuit substrate using a molding material. Due to the molding process, a semiconductor device may be protected from corrosion caused by air or an external environment, mechanical stability of the semiconductor device may be secured, and/or heat generated from the semiconductor device may be effectively exhausted. A first direction X may be a direction in which a molding resin is supplied, a second direction Y may be perpendicular to the first direction X, and a third direction Z may be perpendicular to the first and second directions X and Y.

Referring to FIG. 1, the printed circuit board 10 may include a plurality of chip regions CR and a scribe region SR. At least one semiconductor chip C may be mounted on each of the chip regions CR. The chip regions CR may be arranged in a matrix form along the first direction X and the second direction Y. The semiconductor chips C may be mounted by a flip-chip bonding method. The semiconductor chips C may be mounted using solder bumps 12 of FIG. 2A. The scribe region SR may be provided to surround the chip regions CR. After the molding process is completed, a dicing process may be performed to complete the formation of semiconductor packages.

Figure 2A:
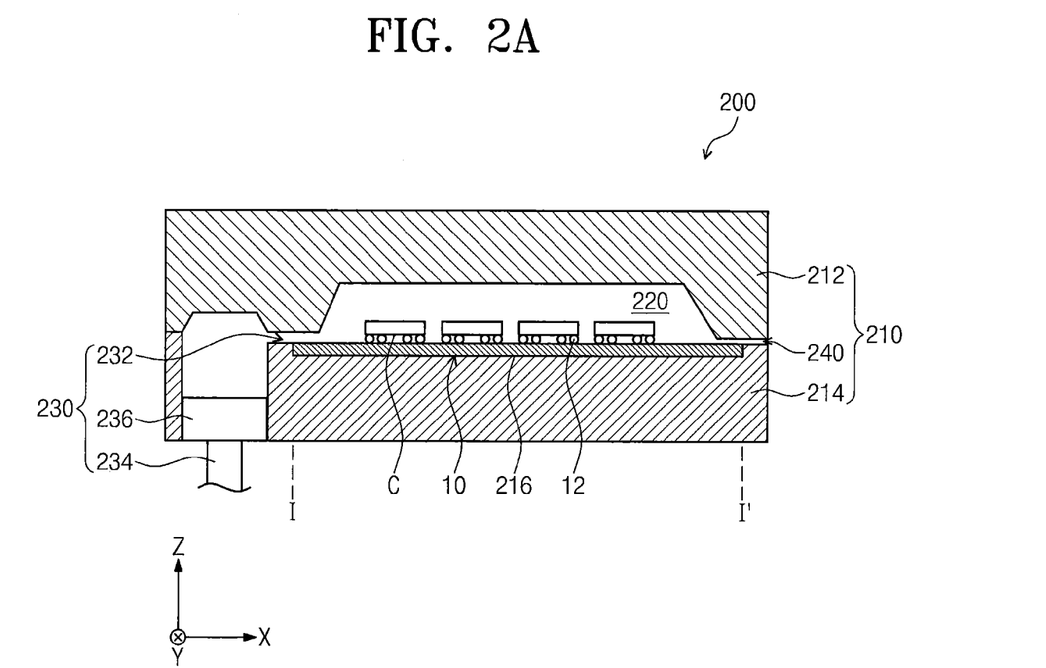
FIG. 2A is a cross-sectional view illustrating the printed circuit board of FIG. 1 disposed in a semiconductor package-manufacturing apparatus.

FIG. 2A is a cross-sectional view illustrating the printed circuit board 10 of FIG. 1 disposed in a semiconductor package-manufacturing apparatus 200. FIG. 2A illustrates a cross section of the printed circuit board 10, which is taken along a line I-I' of FIG. 1. The semiconductor package-manufacturing apparatus 200 may be an apparatus for performing a molding process. The semiconductor package-manufacturing apparatus 200 of FIG. 2A may include a mold unit 210, a supply part 230, and a vent part 240. The mold unit 210 may include a plurality of molds. For example, the mold unit 210 may include a first mold 212 and a second mold 214 that are coupled to each other to form a cavity 220. The cavity 220 may be a space in which the molding process is performed on the printed circuit board 10. The cavity 220 may have a suitable size and a suitable shape which correspond to the printed circuit board 10. The size, the shape, and an area of the cavity 220 may be changed according to a kind and a characteristic of a semiconductor chip. The first mold 212 may correspond to an upper mold 212, and the second mold 214 may correspond to a lower mold 214. At least one of the upper mold 212 or the lower mold 214 may be movable such that the mold unit 210 can be closed and opened. However, the number mold elements and the joining relationship between the mold elements are not limited thereto. The lower mold 214 may include a recess region 216. The recess region 216 may have a size corresponding to the size of the printed circuit board 10, and, thus, the printed circuit board 10 may be received in the recess region 216.

The supply part 230 may be provided at a side of the mold unit 210. The supply part 230 may supply a molding resin 250 of FIG. 2B into the cavity 220. The supply part 230 may include a gate 232, a supply port 234, and a plunger 236. The gate 232 may provide a space through which the molding resin 250 flows into the cavity 220. The supply port 234 may supply the molding resin 250 into the cavity 220. The supply port 234 may have a cylindrical pipe shape. The molding resin 250 may be heated to have a gel state having a predetermined viscosity. Alternatively, the molding resin 250 may be provided in a melted state. The plunger 236 may be vertically movable in the supply port 234. The plunger 236 may pressurize the molding resin 250 such that the molding resin 250 may be supplied into the cavity 220. The molding resin 250 may include an insulating polymer material, such as an epoxy molding compound (EMC). Alternatively, the molding resin 250 may include at least one of other various molding materials.

The vent part 240 may be provided at another side of the mold unit 210. The vent part 240 may be disposed to be opposite to the supply part 230. Thus, the supply part 230 may be disposed in the front and the vent part 240 may be disposed in the rear, when viewed from a cross-sectional view taken along the first direction X. For example, the vent part 240 may be provided at a side of the upper mold 212. The vent part 240 may exhaust air existing in the cavity 220.

Figure 2B:
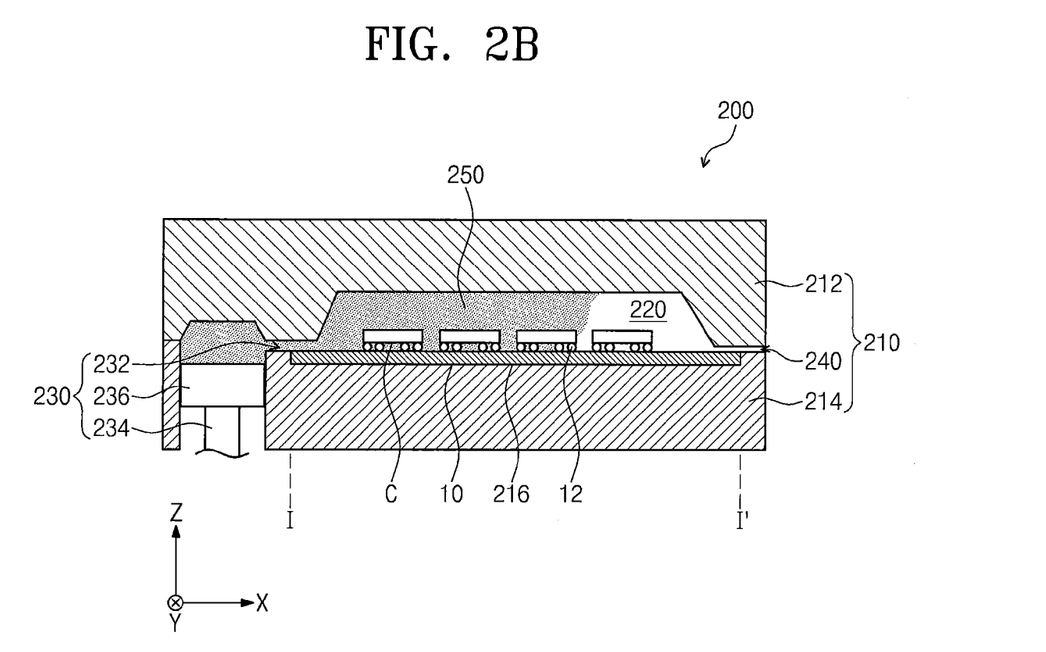
FIGS. 2B to 2D are cross-sectional views illustrating a method of performing a molding process on the printed circuit board of FIG. 1 by the semiconductor package-manufacturing apparatus of FIG. 2A.
Figure 2C:
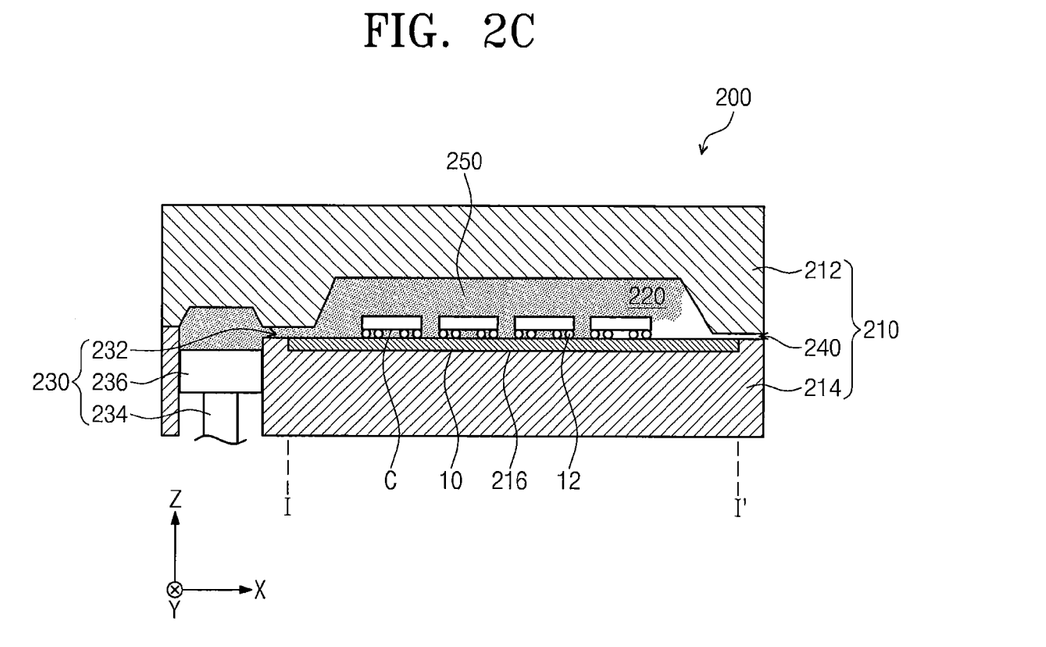
Figure 2D:
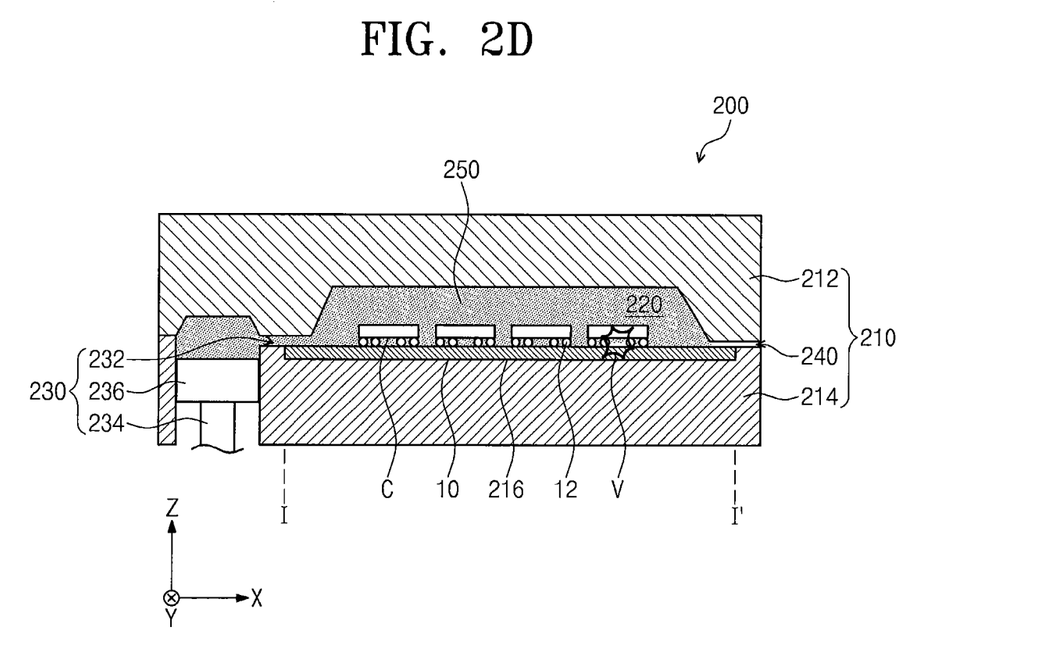

FIGS. 2B to 2D are cross-sectional views illustrating a method of performing a molding process on the printed circuit board 10 of FIG. 1 by the semiconductor package-manufacturing apparatus 200 of FIG. 2A. Hereinafter, the method of performing a molding process on the printed circuit board 10 of FIG. 1 will be described with reference to FIGS. 2A to 2D.

Referring to FIGS. 2A and 2B, the printed circuit board 10 may be provided into the lower mold 214 and then may be received in the lower mold 214. At this time, the printed circuit board 10 may be received in the recess region 216. Thereafter, the upper mold 212 may cover the printed circuit board 10 to close the cavity 220. Even though not shown in the drawings, a portion of the upper mold 212 may clamp an edge region of the printed circuit board 10. Thereafter, the plunger 236 may start to supply the molding resin 250 into the cavity 220. At this time, the molding resin 250 may be an epoxy molding compound (EMC).

Referring to FIG. 2C, when the molding resin 250 is supplied into the cavity 220, a flow rate of the molding resin 250 may be varied according to a position in the cavity 220. For example, the flow rate of the molding resin 250 in first spaces under the semiconductor chips C (i.e., in spaces between the printed circuit board 10 and the semiconductor chips C) may be different from that of the molding resin 250 in second spaces on the semiconductor chips C. The first spaces under the semiconductor chips C may be smaller in volume than the second spaces on the semiconductor chips C, and thus the flow rate of the molding resin 250 in the first spaces may be lower than that of the molding resin 250 in the second spaces. In addition, the solder bumps 12 between the printed circuit board 10 and the semiconductor chips C may impede the flow of the molding resin 250. Thus, the flow rate of the molding resin 250 in the second spaces on the semiconductor chips C may be higher than that of the molding resin 250 in the first spaces under the semiconductor chips C.

Referring to FIG. 2D, a void V may be formed in molding resin 250 provided in the cavity 220 by a difference between the flow rates of the molding resin 250. For example, the void V may be formed in at least one of the first spaces under the semiconductor chips C. While the molding resin 250 covers the semiconductor chips C through the second spaces, air may be trapped in at least one of the first spaces under the semiconductor chips C by the low flow rate of the molding resin 250 in the first spaces. Thus, the void V may be formed. Thereafter, the molding resin 250 may be hardened, and then a dicing process may be performed to separate semiconductor packages from each other. At this time, at least one of the semiconductor packages may include the void V. The void V may cause a defect in the semiconductor package and may reduce the reliability of the semiconductor package.

Figure 3A:
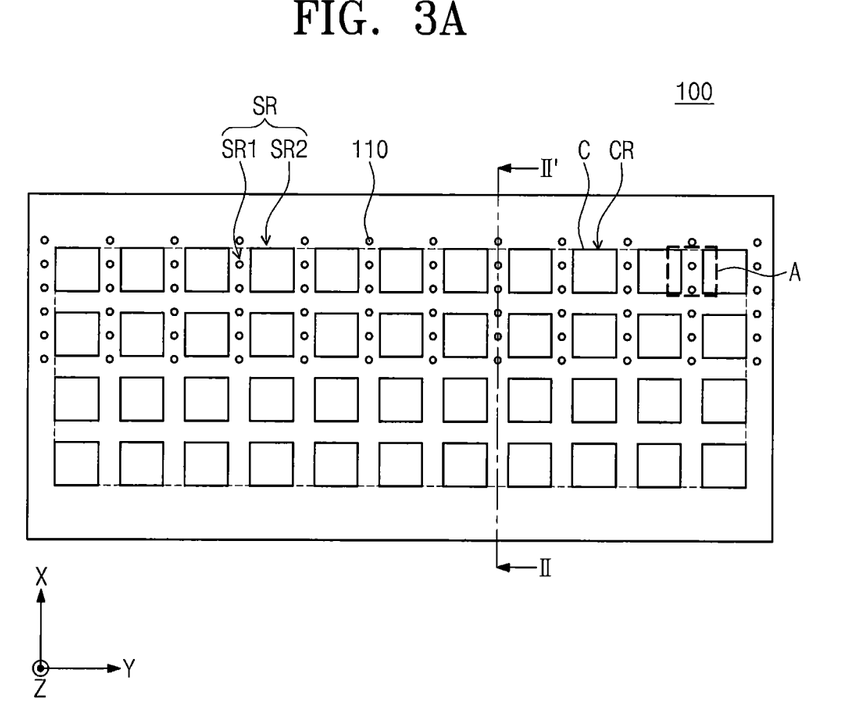
FIG. 3A is a plan view illustrating a printed circuit board according to some embodiments of the inventive concept.
Figure 3B:
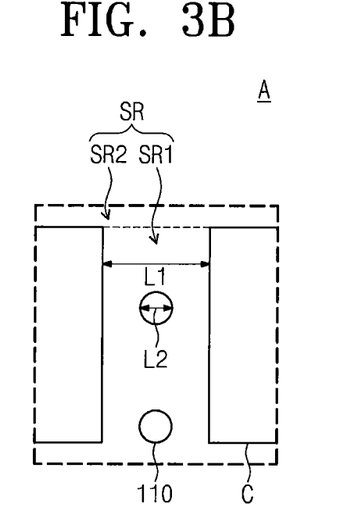
FIG. 3B is an enlarged view of a portion 'A' of FIG. 3A.

FIG. 3A is a plan view illustrating a printed circuit board 100 according to some embodiments of the inventive concept. FIG. 3B is an enlarged view of a portion 'A' of FIG. 3A. Referring to FIGS. 3A and 3B, the printed circuit board 100 may include a plurality of chip regions CR and a scribe region SR. At least one semiconductor chip C may be mounted on each of the chip regions CR. The semiconductor chips C may be mounted by a flip-chip bonding method. In some embodiments, the semiconductor chips C may be mounted through solder bumps 102 of FIG. 4A. The scribe region SR may be provided to surround the chip regions CR.

The scribe region SR may include a first scribe region SR1 and a second scribe region SR2. The first scribe region SR1 may correspond to a region between the chip regions CR, and the second scribe region SR2 may correspond to a region outside the outermost ones of the chip regions CR. The scribe region SR may include first vent holes 110 formed along the first direction X. The first vent holes 110 may be through-holes penetrating the scribe region SR. The first vent holes 110 formed along the first direction X may be more adjacent to the rear of the printed circuit board 100 in the first direction X than to the front of the printed circuit board 100 in the first direction X. In other words, when the printed circuit board 100 is provided into a semiconductor package-manufacturing apparatus 200, the first vent holes 110 may be provided into a region that is more adjacent to a vent part 240 than to a supply part 230 (see FIG. 4A).

The chip regions CR may be arranged along the first direction X and the second direction Y. In some embodiments, the first vent holes 110 may be provided between the chip regions CR arranged in the second direction Y. As illustrated in FIG. 3A, the first vent holes 110 may be disposed in the first and second scribe regions SR1 and SR2. Alternatively, the first vent holes 110 may be disposed in only the first scribe region SR1. Referring to FIGS. 3A and 3B, at least one first vent hole 110 may be provided between a pair of semiconductor chips C adjacent to each other. In some embodiments, a length (or a distance) L1 between the pair of adjacent semiconductor chips C (e.g., a length L1 of the first scribe region SR1 between a pair of chip regions CR adjacent to each other) may be equal to or greater than a diameter L2 of the first vent hole 110. For example, the length L1 between the pair of adjacent semiconductor chips C may range from about one to about four times the diameter L2 of one of the first vent holes 110. Thus, the first vent holes 110 may not overlap with the semiconductor chips C. Thus, the first vent holes 110 may not be included in a semiconductor package completed using a molding process and a dicing process. As a result, arrangement and shapes of solder bumps 102 for mounting the semiconductor chips C on the chip regions CR may be free.

Figure 4A:
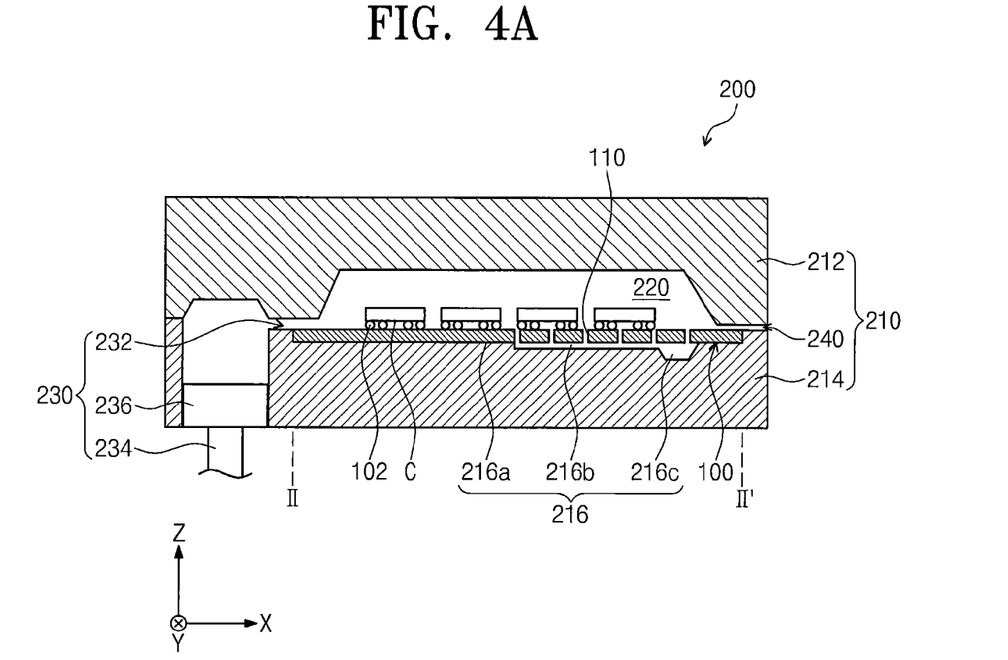
FIG. 4A is a cross-sectional view illustrating the printed circuit board of FIG. 3A disposed in a semiconductor package-manufacturing apparatus according to some embodiments of the inventive concept.

FIG. 4A is a cross-sectional view illustrating the printed circuit board 100 of FIG. 3A disposed in the semiconductor package-manufacturing apparatus 200. FIG. 4A illustrates a cross section of the printed circuit board 100, which is taken along a line II-II' of FIG. 3A. Hereinafter, the same elements of the semiconductor package-manufacturing apparatus as described in the embodiment of FIGS. 2A to 2D will be indicated by the same reference numerals or the same reference designators, and the descriptions thereof will be omitted or mentioned briefly for the purpose of ease and convenience in explanation.

A recess region 216 of a lower mold 214 of FIG. 4A may include a plurality of stepped recess regions 216a. 216b and 216c. In some embodiments, the recess region 216 of the lower mold 214 may include first, second and third recess regions 216a. 216b and 216c that are sequentially arranged along the first direction X. The first recess region 216a may be recessed by a depth corresponding to a thickness of the printed circuit board 100. The second recess region 216b may be provided in a region corresponding to the first vent holes 110 and may be recessed from a bottom surface of the first recess region 216a. Thus, the second recess region 216b may guide a flow of a fluid through the first vent holes 110. A position and a shape of the second recess region 216b may be variously modified according to the positions and shapes of the first vent holes 110. The third recess region 216c may be adjacent to the vent part 240 and may be recessed from a bottom surface of the second recess region 216b. In some embodiments, the third recess region 216c may be formed under the first vent hole 110 nearest to the vent part 240.

FIGS. 4B to 4E are cross-sectional views illustrating a method of performing a molding process on the printed circuit board 100 of FIG. 3A by the semiconductor package-manufacturing apparatus 200 of FIG. 4A. Hereinafter, the method of performing a molding process on the printed circuit board 100 of FIG. 3A will be described with reference to FIGS. 4A to 4E.

Figure 4B:
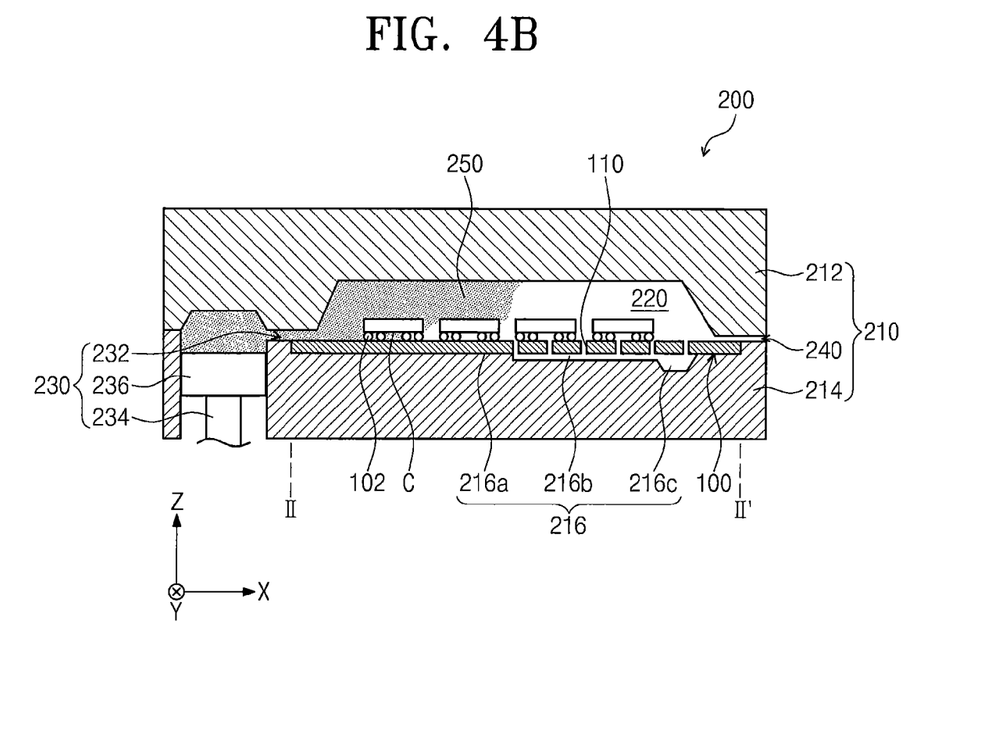
FIGS. 4B to 4E are cross-sectional views illustrating a method of performing a molding process on the printed circuit board of FIG. 3A by the semiconductor package-manufacturing apparatus of FIG. 4A according to some embodiments of the inventive concept.

Referring to FIGS. 4A and 4B, the printed circuit board 100 may be provided into the lower mold 214 and then may be received in the lower mold 214. The printed circuit board 100 may be received in the recess region 216. Thereafter, the upper mold 212 may cover the printed circuit board 100 to close the cavity 220. Even though not shown in the drawings, a portion of the upper mold 212 may clamp an edge region of the printed circuit board 100. Thereafter, the plunger 236 may start to supply the molding resin 250 into the cavity 220. In some embodiments, the molding resin 250 may be an epoxy molding compound (EMC).

Figure 4C:
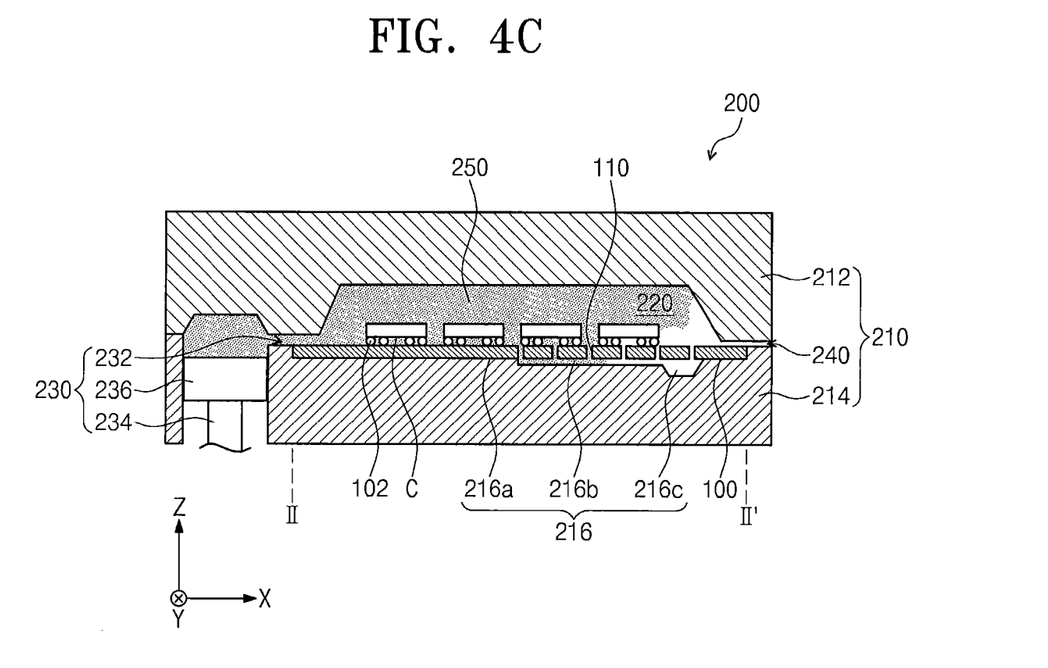
Figure 4D:
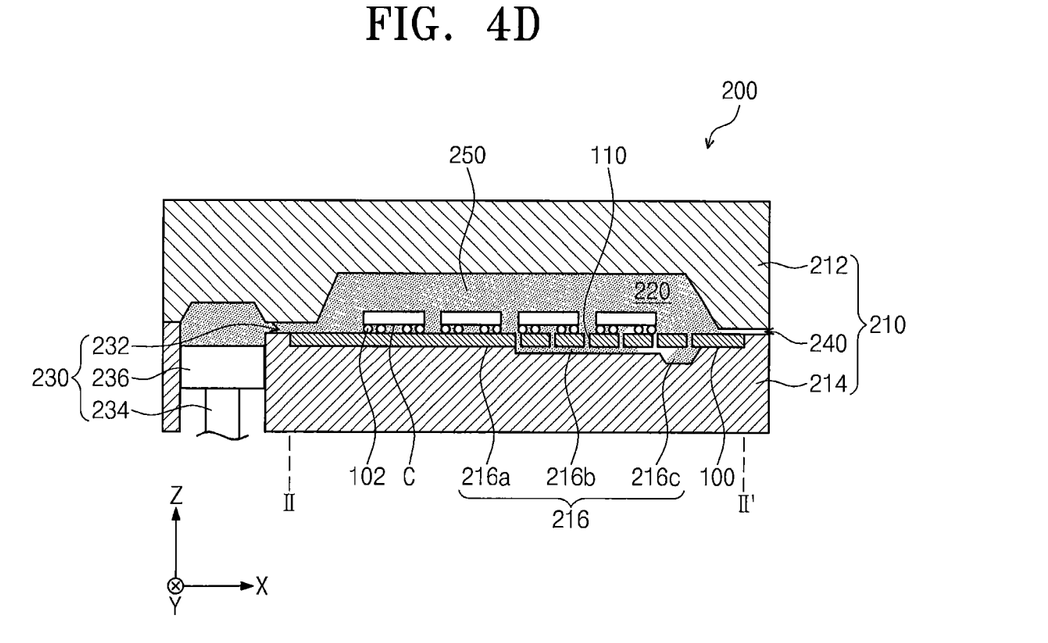
Figure 4E:
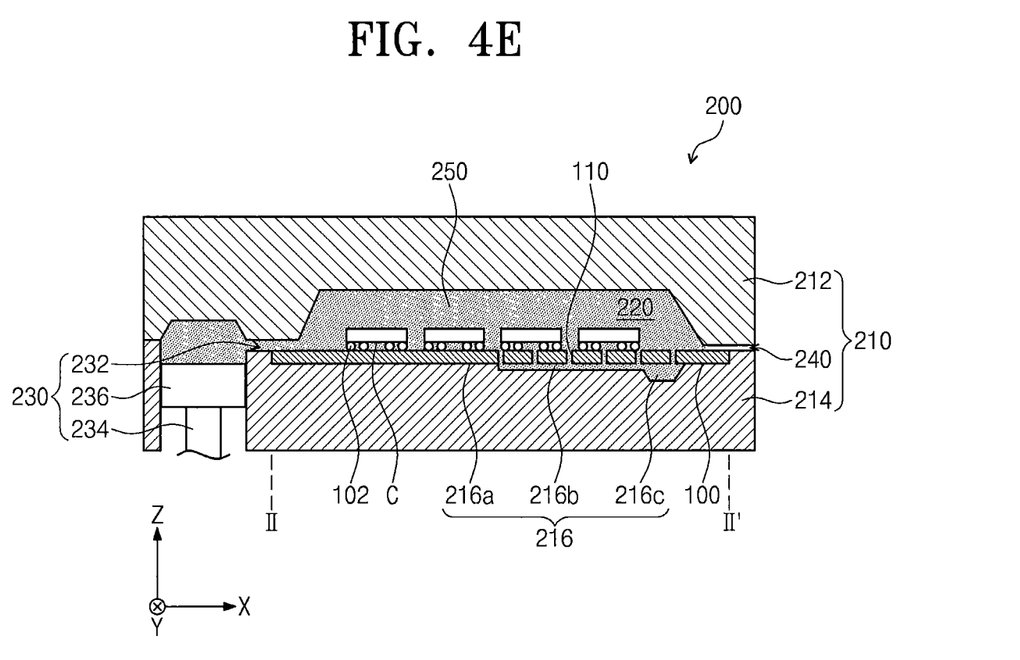

Referring to FIGS. 4C to 4E, when the molding resin 250 is supplied into the cavity 220, a flow rate of the molding resin 250 may be varied according to a position in the cavity 220. For example, the flow rate of the molding resin 250 in first spaces under the semiconductor chips C (i.e., in spaces between the printed circuit board 10 and the semiconductor chips C) may be different from that of the molding resin 250 in second spaces on the semiconductor chips C. The first spaces under the semiconductor chips C may be smaller in volume than the second spaces on the semiconductor chips C, and, thus, the flow rate of the molding resin 250 in the first spaces may be lower than that of the molding resin 250 in the second spaces. In addition, the solder bumps 102 between the printed circuit board 100 and the semiconductor chips C may impede the flow of the molding resin 250. However, the molding resin 250 in the first spaces may flow into the second recess region 216b through the first vent holes 110, and thus the flow of the molding resin 250 may not be stopped, but flowability of the molding resin 250 may be maintained. As a result, it is possible to reduce or minimize a difference between the flow rate of the molding resin 250 in the first spaces under the semiconductor chips C and the flow rate of the molding resin 250 in the second spaces on the semiconductor chips C. In particular, the flow of the molding resin 250 may be accelerated through the second and third recess regions 216b and 216c, and, thus, a spreading rate of the molding resin 250 may be increased and the occurrence probability of a void V may be reduced or minimized. Thereafter, the molding resin 250 may be hardened, and then a dicing process may be performed to complete semiconductor packages separated from each other.

Figure 5:
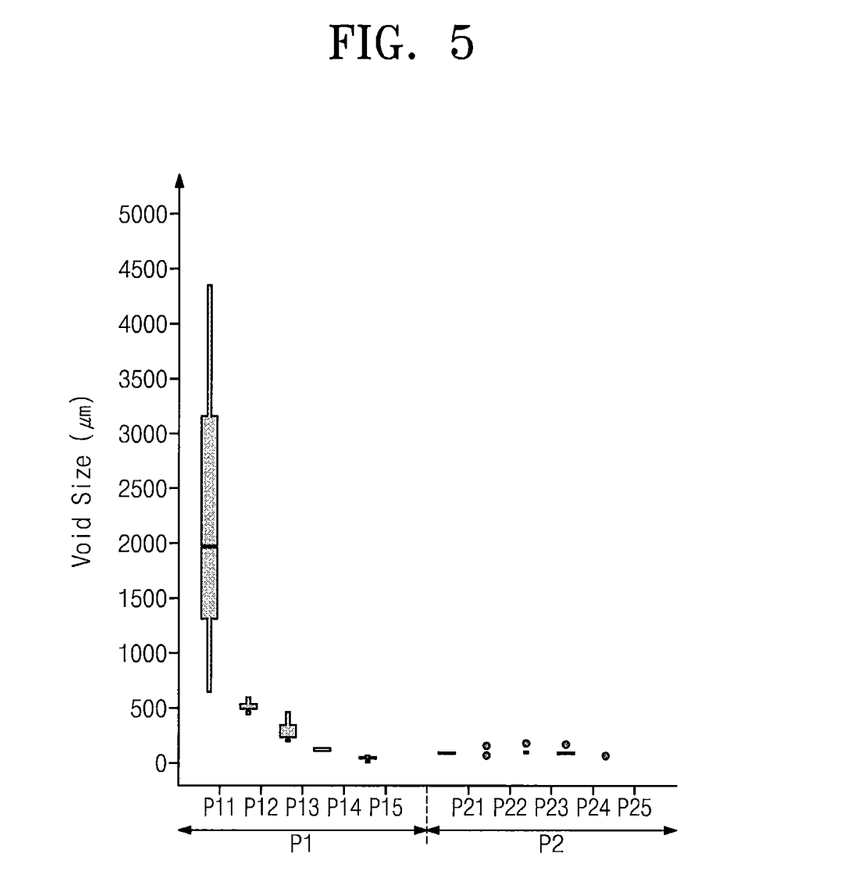
FIG. 5 is a graph illustrating sizes of voids in semiconductor packages formed using printed circuit boards of FIGS. 1 and 3A and the molding processes performed thereon.

FIG. 5 is a graph illustrating sizes of voids in semiconductor packages formed using printed circuit boards 10 and 100 of FIGS. 1 and 3A and the molding processes performed thereon. In FIG. 5, a reference designator P1 shows a case in which the molding process is performed on the printed circuit board 10 of FIG. 1 and a reference designator P2 shows a case in which the molding process is performed on the printed circuit board 100 of FIG. 3A. Here, conditions (e.g., a kind of the molding resin and a process time) of the molding processes may be the same as each other. Measurement positions P11, P12, P13, P14, and P15 of the printed circuit board 10 of FIG. 1 may be the same as measurement positions P21, P22, P23, P24, and P25 of the printed circuit board 100 of FIG. 3A, respectively. Referring to FIG. 5, it is recognized that sizes of voids measured from the measurement positions P21, P22, P23, P24, and P25 of the printed circuit board 100 including the first vent holes 110 are much smaller than those of the voids measured from the measurement positions P11, P12, P13, P14, and P15 of the printed circuit board 10 not including the first one of the vent holes 110.

Figure 6:
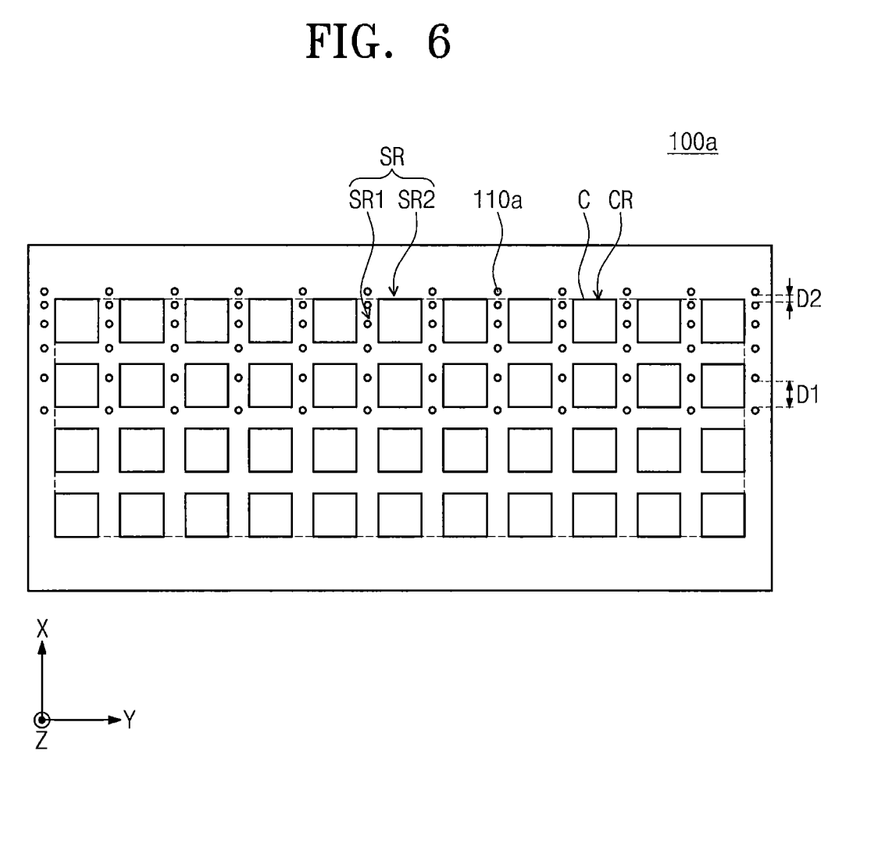
FIG. 6 is a plan view illustrating a printed circuit board according to some embodiments of the inventive concept.

FIG. 6 is a plan view illustrating a printed circuit board 100a according to some embodiments of the inventive concepts. In the printed circuit board 100a, the same elements as described in the embodiments of FIGS. 3A and 3B will be indicated by the same reference numerals or the same reference designators and the descriptions thereof will be omitted or mentioned briefly for the purpose of ease and convenience in explanation. Distances D1 and D2, each of which is between a pair of first ones of the vent holes 110a adjacent to each other in the scribe region SR of the printed circuit board 100a, may be sequentially reduced along the first direction X. In other words, a density of the first vent holes 110a may become progressively greater toward the vent part 240 of the semiconductor package-manufacturing apparatus 200 when viewed from a cross-sectional view taken along the first direction X. As illustrated in FIG. 6, the distances D1 and D2 between the first ones of the vent holes 110a may be continuously reduced (i.e., monotonically decreasing in distance). Alternatively, the distances D1 and D2 between the first vent holes 110a may be discontinuously reduced (i.e., non-monotonically decreasing in distance). The flowability of the molding resin 250 may be gradually reduced along the first direction X. According to the present embodiment, the density of the first vent holes 110a may be controlled to improve the flowability of the molding resin 250.

Figure 7:
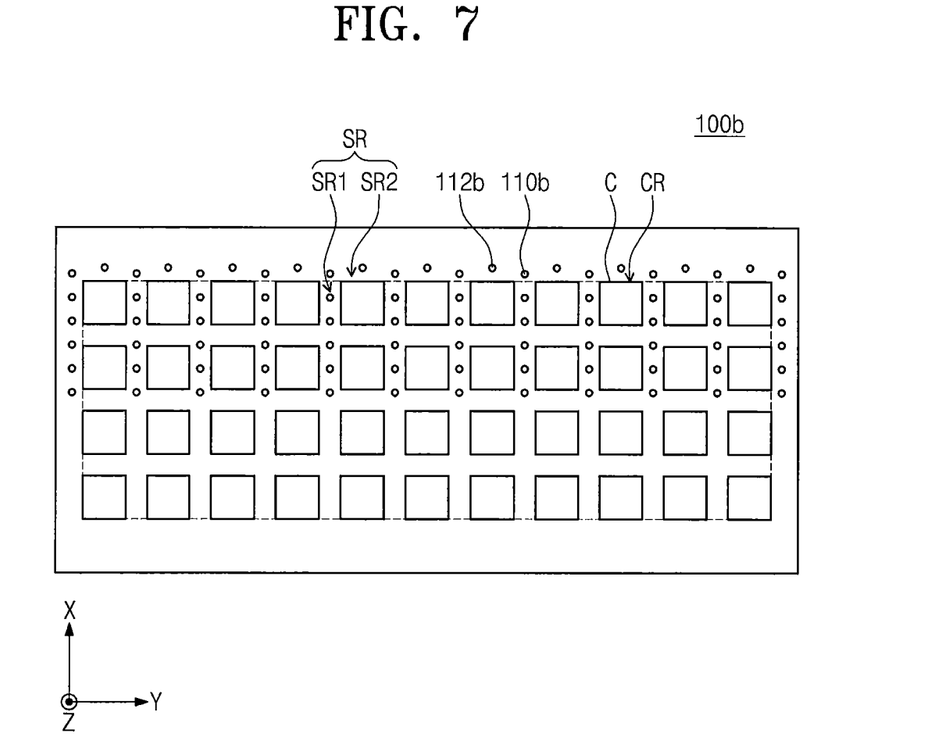
FIG. 7 is a plan view illustrating a printed circuit board according to some embodiments of the inventive concept.
Figure 8:
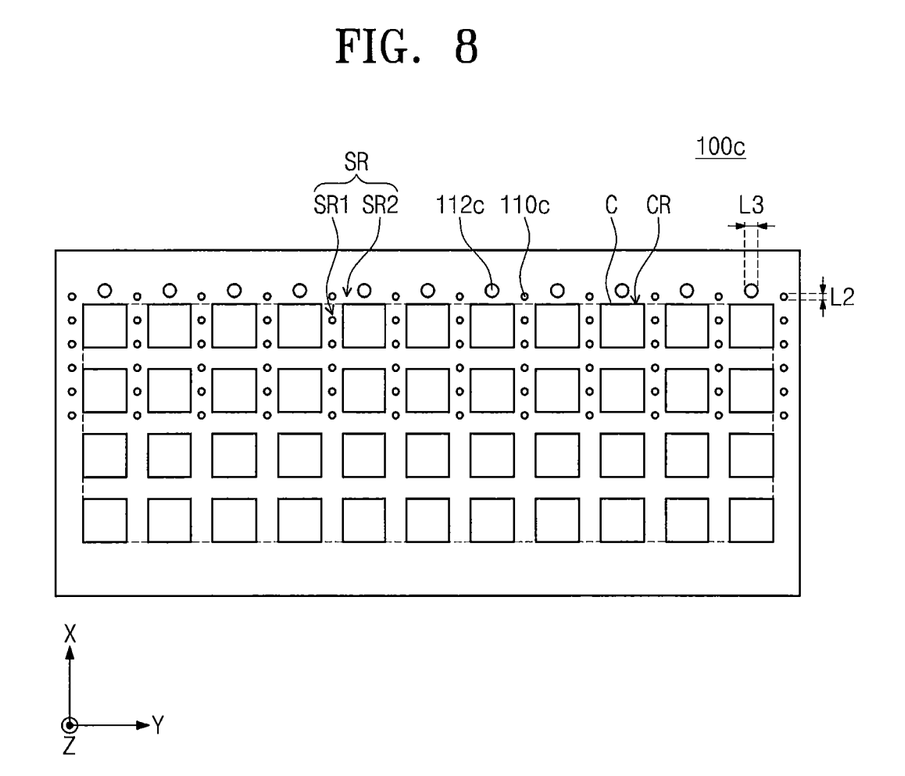
FIG. 8 is a plan view illustrating a printed circuit board according to some embodiments of the inventive concept.

FIG. 7 is a plan view illustrating a printed circuit board 100b according to some embodiments of the inventive concepts. FIG. 8 is a plan view illustrating a printed circuit board 100c according to some embodiments of the inventive concepts. In the printed circuit boards 100b and 100c, the same elements as described in the embodiment of FIGS. 3A and 3B will be indicated by the same reference numerals or the same reference designators and the descriptions thereof will be omitted or mentioned briefly for the purpose of ease and convenience in explanation. The printed circuit boards 100b and 100c may further include second vent holes (112b of FIGS. 7 and 112c of FIG. 8) that are arranged along the second direction Y. In some embodiments, the second vent holes 112b of FIGS. 7 and 112c of FIG. 8 may be formed in the scribe region SR. For example, the second vent holes 112b of FIGS. 7 and 112c of FIG. 8 may be formed in the second scribe region SR2. The flowability of the molding resin 250 may be gradually reduced along the first direction X. According to the present embodiments, the second vent holes 112b of FIGS. 7 and 112c of FIG. 8 may be additionally provided to increase the number of paths of the molding resin 250. As a result, the flowability of the molding resin 250 may be improved. As illustrated in FIG. 7, the second vent holes 112b may have the same size (e.g., the same diameter) as the first vent holes 110b. Alternatively, as illustrated in FIG. 8, diameters L3 of the second vent holes 112c may be greater than diameters L2 of first vent holes 110c. The second vent holes 112b of FIGS. 7 and 112c of FIG. 8 may be provided in the second scribe region SR2 disposed outside the chip regions CR, and thus the flow of the molding resin 250 according to the sizes of the second vent holes 112b of FIGS. 7 and 112c of FIG. 8 may not influence the semiconductor chips C. The embodiments in which the second vent holes 112b and 112c are formed in the second scribe region SR2 are illustrated as examples in FIGS. 7 and 8. However, embodiments of the inventive concept are not limited thereto. In certain embodiments, the second vent holes may be formed in the first scribe region, or the positions of the second vent holes may be variously modified. Alternatively, the diameters of the second vent holes may be smaller than diameters of first vent holes.

Embodiments of the inventive concepts may provide a printed circuit board for a molding process, which is capable of preventing or reducing the likelihood of the formation of a void. In some embodiments, because the vent holes do not overlap with the semiconductor chips mounted on the printed circuit board, the arrangement and shapes of the semiconductor chips mounted on the chip regions may be free. For example, the vent holes may not influence the arrangement and connection structure of the solder bumps, and, thus, it is possible to freely manufacture a memory semiconductor package or a mobile semiconductor package.

According to some embodiments of the inventive concept, it is possible to manufacture a semiconductor package including a molding layer with an improved sealing characteristic.

According to some embodiments of the inventive concept, a semiconductor package with improved mechanical and/or electrical reliability may be manufactured by reducing defects, such as, for example, cracks that may be caused due to a void in molding layer.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A printed circuit board comprising:
   chip regions on which semiconductor chips are respectively mounted; and
   a scribe region surrounding each of the chip regions,
   wherein the scribe region comprises first vent holes that are configured to receive a flow of a molding resin, the first vent holes being arranged along a first direction corresponding to a flow direction of the molding resin.

2. The printed circuit board of claim 1, wherein the first vent holes do not overlap with the semiconductor chips.

3. The printed circuit board of claim 1, wherein the semiconductor chips are arranged along a second direction perpendicular to the first direction, and
   wherein the first vent holes are formed between the semiconductor chips arranged along the second direction.

4. The printed circuit board of claim 3, wherein at least one of the first vent holes is provided between a pair of semiconductor chips adjacent to each other in the second direction, and
   wherein a distance between the pair of semiconductor chips is equal to or greater than a diameter of the at least one of the first vent holes.

5. The printed circuit board of claim 4, wherein the distance between the pair of semiconductor chips ranges from about one to about four times the diameter of the at least one of the first vent holes.

6. The printed circuit board of claim 1, wherein the first vent holes, which are formed along the first direction, are closer to a rear of the printed circuit board in the first direction than to a front of the printed circuit board in the first direction.

7. The printed circuit board of claim 1, wherein distances between adjacent ones of the first vent holes formed along the first direction are sequentially reduced in the first direction.

8. The printed circuit board of claim 1, wherein the scribe region comprises:
   a first scribe region provided between the chip regions; and a second scribe region provided outside outermost ones of the chip regions,
wherein the scribe region further comprises second vent holes formed in the second scribe region along a second direction perpendicular to the first direction.

9. The printed circuit board of claim 8, wherein diameters of the second vent holes are equal to or greater than diameters of the first vent holes.

10. The printed circuit board of claim 1, wherein the semiconductor chips are mounted on the respective chip regions by a flip-chip bonding method.

11. A printed circuit board comprising:
chip regions on which semiconductor chips are respectively mounted; and
a scribe region surrounding each of the chip regions,
wherein the scribe region comprises:
a first scribe region provided between the chip regions; and
a second scribe region provided outside outermost ones of the chip regions,
wherein the first scribe region comprises vent holes.

12. The printed circuit board of claim 11, wherein the vent holes do not overlap with the semiconductor chips.

13. The printed circuit board of claim 11, wherein the vent holes are configured to receive a flow of molding resin, the vent holes being arranged along a direction corresponding to a flow direction of the molding resin.

14. The printed circuit board of claim 11, wherein a length of the first scribe region between a pair of the chip regions adjacent to each other is equal to or greater than diameters of the vent holes.

15. The printed circuit board of claim 11, wherein the semiconductor chips are mounted on the respective chip regions by a flip-chip bonding method.

16. A printed circuit board, comprising:
chip regions having semiconductor chips mounted thereon, respectively;
scribe regions between the chip regions; and
vent holes in a first portion of the scribe regions that are configured to receive a flow of a molding resin crossing a second portion of the scribe regions, the vent holes being arranged along a direction corresponding to a flow direction of the molding resin.

17. The printed circuit board of claim 16, wherein the semiconductor chips and the vent holes do not overlap.

18. The printed circuit board of claim 16, wherein the vent holes are first vent holes and the direction is a first direction, further comprising:
second vent holes in an edge region along a periphery of the chip regions, the second vent holes being arranged in a second direction that is not parallel to the first direction.

19. The printed circuit board of claim 18, wherein spacing between adjacent ones of the first vent holes decreases with increasing proximity of the first vent holes to the edge region.

20. The printed circuit board of claim 18, wherein diameters of the second vent holes are larger than diameters of the first vent holes.

* * * * *